United States Patent
Hoppel et al.

(10) Patent No.: US 11,533,838 B2
(45) Date of Patent: Dec. 27, 2022

(54) APPARATUS AND METHOD FOR POWERING A GARMENT

(71) Applicant: Green Industry Innovators, L.L.C., Louisville, OH (US)

(72) Inventors: Steffon Hoppel, Louisville, OH (US); Todd Pugh, Louisville, OH (US)

(73) Assignee: GREEN INDUSTRY INNOVATORS, L.L.C., Louisville, OH (US)

( * ) Notice: Subject to any disclaimer, the term of this patent is extended or adjusted under 35 U.S.C. 154(b) by 1042 days.

(21) Appl. No.: 16/226,952

(22) Filed: Dec. 20, 2018

(65) Prior Publication Data

US 2019/0191624 A1 Jun. 27, 2019

Related U.S. Application Data

(60) Provisional application No. 62/610,692, filed on Dec. 27, 2017.

(51) Int. Cl.
*A01D 34/00* (2006.01)
*A41D 13/005* (2006.01)
(Continued)

(52) U.S. Cl.
CPC .......... *A01D 34/001* (2013.01); *A01D 34/78* (2013.01); *A01D 43/00* (2013.01); *A01D 69/02* (2013.01);
(Continued)

(58) Field of Classification Search
CPC ........ A01D 1/00; A01D 34/00; A01D 13/005; A01D 101/00; A01D 34/001; A01D 34/78; A01D 43/00; A01D 69/02; A01D 2101/00; A41D 1/005; A41D 1/02; A41D 1/04; A41D 3/02; A41D 13/0051; A41D 13/0053; A41D 13/005; A41D 2400/12; H01L 35/30; H02J 7/00; H02J 7/0068; H02K 5/22; H02K 11/00; H02K 7/18; H02K 5/225; H02K 7/02; H02K 7/1815; H02K 11/0094; E01H 5/08; H01R 13/70; H01R 2201/26; H05B 2203/036
See application file for complete search history.

(56) References Cited

U.S. PATENT DOCUMENTS 4,273,989 A 6/1981 Hinton et al.
4,691,762 A 9/1987 Elkins et al.
(Continued)

FOREIGN PATENT DOCUMENTS

WO 2019071237 4/2019

*Primary Examiner* — Robert L Deberadinis
(74) *Attorney, Agent, or Firm* — Sand, Sebolt & Wernow Co., LPA

(57) ABSTRACT

A lawn mower has an electrical port that receives current from an alternator powered by the lawn mower engine. The current and voltage sent the electrical port depend on a flywheel and stator arrangement operatively connected to the alternator. The stator may be replaceable or interchangeable to selectively determine the alternator current and voltage output. The port receives a plug from a garment worn by the lawn mower operator. The garment includes one or more thermo-electric elements that are powered from current extending through the port. The thermo-electric elements may be resistive heaters to warm the operator or TEC coolers to cool the operator. Furthermore, the garment may include a rechargeable battery that powers the thermo-electric elements when the plug is disconnected from the port.

16 Claims, 3 Drawing Sheets

(51) Int. Cl.
- *H02K 5/22* (2006.01)
- *H02K 11/00* (2016.01)
- *H02K 7/18* (2006.01)
- *A41D 1/00* (2018.01)
- *H02J 7/00* (2006.01)
- *A01D 69/02* (2006.01)
- *A01D 34/78* (2006.01)
- *A41D 1/04* (2006.01)
- *H01L 35/30* (2006.01)
- *H02K 7/02* (2006.01)
- *A41D 1/02* (2006.01)
- *A01D 43/00* (2006.01)
- *A41D 3/02* (2006.01)
- *A01D 101/00* (2006.01)
- *H01R 13/70* (2006.01)
- *E01H 5/08* (2006.01)

(52) U.S. Cl.
CPC .............. *A41D 1/005* (2013.01); *A41D 1/02* (2013.01); *A41D 1/04* (2013.01); *A41D 3/02* (2013.01); *A41D 13/0051* (2013.01); *A41D 13/0053* (2013.01); *H01L 35/30* (2013.01); *H02J 7/0068* (2013.01); *H02K 5/225* (2013.01); *H02K 7/02* (2013.01); *H02K 7/1815* (2013.01); *H02K 11/0094* (2013.01); *A01D 2101/00* (2013.01); *A41D 13/005* (2013.01); *A41D 2400/12* (2013.01); *E01H 5/08* (2013.01); *H01R 13/70* (2013.01); *H01R 2201/26* (2013.01); *H05B 2203/036* (2013.01)

(56) References Cited

U.S. PATENT DOCUMENTS

| | | | |
|---|---|---|---|
| 5,008,517 | A | 4/1991 | Brekkestran et al. |
| 6,915,641 | B2 | 7/2005 | Harvie |
| 8,281,609 | B1 | 10/2012 | Rothschild et al. |
| 2003/0196254 | A1 | 10/2003 | Forgach |
| 2008/0306433 | A1 | 12/2008 | Cesaroni |
| 2010/0084125 | A1 | 4/2010 | Goldstein et al. |
| 2011/0108538 | A1 | 5/2011 | Gray et al. |
| 2012/0227432 | A1 | 9/2012 | Creech et al. |
| 2013/0074466 | A1 | 3/2013 | Zwieg et al. |
| 2014/0222121 | A1 | 8/2014 | Spence et al. |
| 2016/0198776 | A1 | 7/2016 | Stevens et al. |
| 2016/0206018 | A1 | 7/2016 | Barbret |
| 2016/0227848 | A1 | 8/2016 | Majoros |
| 2017/0095013 | A1 | 4/2017 | Bessette et al. |
| 2017/0122325 | A1 | 5/2017 | Seman, Jr. et al. |
| 2018/0103694 | A1 | 4/2018 | Fortenbacher |
| 2018/0206401 | A1 | 7/2018 | Simmons et al. |
| 2018/0317573 | A1 | 11/2018 | Devito |
| 2019/0066495 | A1 | 2/2019 | Eisheemy |
| 2019/0075726 | A1 | 3/2019 | White et al. |
| 2019/0191624 | A1 | 6/2019 | Hoppel et al. |
| 2019/0191787 | A1 | 6/2019 | Hoppel et al. |
| 2019/0208836 | A1 | 7/2019 | Demers et al. |
| 2019/0229580 | A1 | 7/2019 | Edwards et al. |
| 2019/0238083 | A1 | 8/2019 | White et al. |
| 2019/0247995 | A1 | 8/2019 | Hocine et al. |
| 2019/0260210 | A1 | 8/2019 | Peloquin, Jr. et al. |
| 2019/0261704 | A1 | 8/2019 | Sonnenberg et al. |
| 2019/0289929 | A1 | 9/2019 | Bessette et al. |
| 2019/0299882 | A1 | 10/2019 | Lecointre et al. |
| 2019/0300035 | A1 | 10/2019 | Colton et al. |
| 2019/0337548 | A1 | 11/2019 | Colton et al. |
| 2019/0359198 | A1 | 11/2019 | Velderman et al. |

APPARATUS AND METHOD FOR POWERING A GARMENT

CROSS REFERENCE TO RELATED APPLICATION

This application claims the benefit of U.S. Provisional Application Ser. No. 62/610,692, filed on Dec. 27, 2017; the disclosure of which is incorporated herein by reference.

TECHNICAL FIELD

The present disclosure relates generally to outdoor drivable power units or machines, such as lawn mowers or snow blowers/throwers, and a garment(s) worn by the operator of the powered drivable machine. More particularly, the present disclosure relates to a powered drivable machine that includes an electrical port through which the operator may connect an electrically powered garment configured to either warm or cool the operator.

BACKGROUND

Background Information

Outdoor yard/property maintenance and lawn care may be accomplished in a number of different ways. Some people choose riding mowers or other zero turn standing mowers to accomplish their yard mowing tasks. Some people choose snow blowers/snow throwers to accomplish their snow removal tasks.

Ordinarily, snow blowers and riding mowers have a gas combustion engine supported by a frame and an alternator connected thereto. The alternator on the riding mower or snow thrower is utilized to output an electrical current ordinarily used to charge a conventional battery that is supported by the machine and is not configured to be removed from the machine unless the battery needs replaced.

Clearly, when snow removal is required, the weather is cold. Sometimes lawn maintenance is required even when the outside weather is less than ideal. For example, a homeowner's grass may still need mowed even though the outside temperature is cold. Additionally, the grass may still need mowed even when the outside temperature is hot. These weather conditions may become uncomfortable for the mower operator.

Typically, the operators will wear clothing to accommodate and account for the weather/temperature conditions. But there may be some instances where a garment of clothing is still insufficient to provide protection and comfort for the outside weather/temperature conditions.

SUMMARY

Issues continue to exists with engine drivable outdoor power units, which may be in the form of a lawn mower or a snow thrower, and the clothing worn by the operator, inasmuch as the operator may need to be warmed on cold days or may need to be cooled on hot days. The present disclosure addresses these and other issues.

In one aspect, the disclosure may provide a system comprising: an engine powered drivable machine (such as a zero-turn stand up riding lawn mower or other riding mowers or a snow thrower) including an alternator and an electrical port operatively connected to the alternator to provide electrical power therethrough when a plug is plugged into the port; a garment sized to be worn by an operator of the engine powered drivable machine, wherein the garment includes at least one electrically powered thermo-electric element electrically coupled to the plug; and wherein when the plug is connected to the port, the at least one thermo-electric element draws power from the machine to change temperature in order to warm or cool the operator wearing the garment.

In one aspect, the disclosure may provide a riding mower comprising: a front end spaced form a rear end defining a longitudinal direction therebetween; an alternator powered by an engine supported by a mower frame; a flywheel and stator combination operatively connected to the alternator directing the alternator voltage output; an electrical port in electrical communication with the alternator providing electrical current therethrough when an electrically powered garment worn by a riding mower operator is connected to the electrical port.

In another aspect, the disclosure may provide a system comprising: an engine powered and drivable machine (i.e., a lawn mower) including an alternator and an electrical outlet (i.e., a port) operably coupled to the outlet to provide electrical power therethrough when an item is plugged into the outlet; a garment sized to be worn by an operator of the machine, wherein the garment includes a plurality of electrically powered elements electrically coupled to a plug configured to either warm or cool the operator when electrically powered, wherein when the plug is operably connected to the outlet, the electrically powered elements draw power from the machine to either increase in temperature to warm the operator wearing the garment or decrease in temperature to cool the operator wearing the garment.

In another aspect, the disclosure may provide a method comprising the steps of: driving a lawn mower including an electrical port receiving current generated from an alternator; sending the current through the electrical port into a plug and through a wire electrically connected to a garment; and powering a thermo-electric element in the garment with the current, wherein the thermo-electric element performs one of the following tasks: (i) warming a mower operator wearing the garment, and (ii) cooling the mower operator wearing the garment. The step of sending the current through the electrical port may be accomplished by selectively actuating a switch on the electrical port between on and off positions. The step of powering the thermo-electric element in the garment may be accomplished by charging, depleting, and recharging a supplemental battery carried by the garment, wherein the supplemental battery is distinct from a mower battery.

In another aspect, the disclosure may provide a lawn mower including an electrical port that receives current from an alternator powered by the lawn mower engine. The current and voltage sent the electrical port depend on a flywheel and stator arrangement operatively connected to the alternator. The stator may be replaceable or interchangeable to selectively determine the alternator current and voltage output. The port receives a plug from a garment worn by the lawn mower operator. The garment includes one or more thermo-electric elements that are powered from current extending through the port. The thermo-electric elements may be resistive heaters to warm the operator or TEC coolers to cool the operator. Furthermore, the garment may include a rechargeable battery that powers the thermo-electric elements when the plug is disconnected from the port.

In one aspect, an embodiment of the present disclosure may provide a garment to be worn by an operator of a lawn mower, the garment comprising: an electrically powered element coupled to a portion of the garment configured to heat or cool the operator while wearing the garment; a wire coupled to the electrically powered element having a portion of the wire extending outward from the garment; and a plug connected to the wire that plugs into a complementary port on the riding mower, wherein when the plug is connected with the port, electrical current flows from the riding mower through the wire and towards the electrically powered element. This exemplary embodiment or another exemplary embodiment may further provide wherein when the plug is disconnected from the port on the lawn mower, electrical current does not flow through the portion of the wire extending outwardly from the garment. This exemplary embodiment or another exemplary embodiment may further provide wherein a battery coupled to the electrically powered element. This exemplary embodiment or another exemplary embodiment may further provide wherein battery activation logic programmed to power the electrically powered element with current from the battery when the plug is disconnected from the port on the lawn mower. This exemplary embodiment or another exemplary embodiment may further provide wherein instructions in the battery activation logic to automatically initiate current movement to the electrically powered element in response to disconnection of the plug from the complementary port on the lawn mower. This exemplary embodiment or another exemplary embodiment may further provide wherein instructions in the battery activation logic to permit selective current movement to the electrically powered element, as selected by the operator, in response to disconnection of the plug from the complementary port on the lawn mower. This exemplary embodiment or another exemplary embodiment may further provide wherein an electrical regulator coupled to the wire configured to transform current or voltage flowing from the lawn mower through the wire. This exemplary embodiment or another exemplary embodiment may further provide wherein wiring that electrically powers the battery and the electrically powered element simultaneously in parallel. This exemplary embodiment or another exemplary embodiment may further provide wherein a releasable connector that releasably connects the battery to the garment. This exemplary embodiment or another exemplary embodiment may further provide wherein a releasable connector that releasably connects the electrically powered element to the garment. This exemplary embodiment or another exemplary embodiment may further provide wherein the electrically powered element is non-removably integrated into the garment. This exemplary embodiment or another exemplary embodiment may further provide wherein the electrically powered element is an electrically resistive heating wire. This exemplary embodiment or another exemplary embodiment may further provide wherein the electrically powered element is a thermoelectric cooler (TEC). This exemplary embodiment or another exemplary embodiment may further provide a bottom hem, wherein the portion of the wire extending outward from the garment extends from the bottom hem. This exemplary embodiment or another exemplary embodiment may further provide wherein the bottom hem is positioned adjacent the port when the operator is on the lawn mower, wherein when the lawn mower is a riding mower, the port is positioned at a height in a range from about 25 inches to about 40 inches above an operator support on the riding mower. This exemplary embodiment or another exemplary embodiment may further provide a sleeve, wherein the portion of the wire extending outward from the garment extends from the sleeve. This exemplary embodiment or another exemplary embodiment may further provide a chest region, wherein the portion of the wire extending outward from the garment extends from the chest region. This exemplary embodiment or another exemplary embodiment may further provide wherein the garment is free of a battery.

In another aspect, an exemplary embodiment of the present disclosure may provide a method comprising: combusting fuel in an engine of a lawn mower; generating current from a device coupled to the engine; directing current from the device to a port on the lawn mower; receiving a plug of a garment worn by an operator of the lawn mower in the port; and powering an electrical element in the garment with current from the lawn mower. This exemplary embodiment or another exemplary embodiment may further provide moving the lawn mower with the plug connected to the port. This exemplary embodiment or another exemplary embodiment may further provide charging a supplemental battery carried by the garment in response to the plug being connected to the port. This exemplary embodiment or another exemplary embodiment may further provide powering, simultaneously in parallel, a resistive heating element in the garment and a battery carried by the garment. This exemplary embodiment or another exemplary embodiment may further provide disconnecting the plug from the port; effecting an operator to dismount the lawn mower such that the resistive heating element in the garment is powered with the battery that was charged when the plug was connected to the port. This exemplary embodiment or another exemplary embodiment may further provide transforming the current from a higher first voltage to a lower second voltage prior to current exiting the port on the lawn mower. This exemplary embodiment or another exemplary embodiment may further provide wherein the current is transformed from a higher first voltage to a lower second voltage after exiting the port on the lawnmower via a transformer carried in the garment. This exemplary embodiment or another exemplary embodiment may further provide switching, via a first switch adjacent the port, between an on-state and an off-state, wherein current is able to flow through the port when the switch in in the on-state and is unable to flow through the port when the switch is in the off-state. This exemplary embodiment or another exemplary embodiment may further provide switching, via a second switch, between a higher first voltage and a lower second voltage of the current flowing through the port when the first switch is in the on-state. This exemplary embodiment or another exemplary embodiment may further provide transmitting current from the port through a wire extending outwardly from the garment; wherein the wire extending outwardly from the garment is coupled to the electrical element in the garment and the electrical element is selected from a group comprising a thermoelectric cooler (TEC), a resistive heating element, and a supplemental battery.

In yet another aspect, an exemplary embodiment of the present disclosure may provide a method comprising: donning a garment carrying an electrical device; mounting a lawn mower; connecting a wire and plug extending outwardly from the garment to an electrical port on the lawn mower; turning on an engine of the lawn mower; driving the lawn mower; and receiving electrical power from the lawn mower through the port and into the electrical device in garment via the wire and plug. This exemplary embodiment or another exemplary embodiment may further provide disconnecting the wire and plug from the electrical port on the lawn mower; dismounting the lawn power; performing a secondary action remote from the lawn mower; and effecting electrical current to move through the electrical device in the garment while dismounted from the lawn mower and performing the secondary action remote from the lawn mower. This exemplary embodiment or another exemplary embodiment may further provide wherein effecting electrical current to move through the electrical device in the garment while dismounted from the lawn mower is accomplished by depleting potential energy from a battery carried by the garment that was charging when the wire and plug were connected to the electrical port on the lawn mower. This exemplary embodiment or another exemplary embodiment may further provide wherein donning the garment further comprises: inserting a first arm of an operator through a first sleeve of the garment and inserting a second arm of the operator through a second sleeve of the garment; and positioning the wire and plug at a height in a range from about 25 inches to about 40 inches above an operator support on the lawn mower. This exemplary embodiment or another exemplary embodiment may further provide wherein receiving electrical power from the lawn mower through the port and into the electrical device in garment via the wire and plug further comprises: receiving electrical power simultaneously in parallel to a resistive heating element and a supplemental battery carried by the garment; wherein the resistive heating element is powered by current from the lawn mower when the wire and plug are connected with the electrical port while simultaneously charging the supplemental battery; and wherein the supplemental battery powers the resistive heating element when the wire and plug are disconnected from the electrical port on the lawn mower. This exemplary embodiment or another exemplary embodiment may further provide actuating a first switch on the lawn mower to switch electrical port the electrical port from an off-state to an on-state; and actuating a second switch on the lawn mower to switch voltage moving through the electrical port from a higher first voltage to a lower second voltage. This exemplary embodiment or another exemplary embodiment may further provide receiving, automatically, current through the wire and plug connect to the electrical port in response to plugging the plug into the electrical port; wherein the electrical port on the lawn mower is a Universal Serial Bus (USB) port.

BRIEF DESCRIPTION OF THE SEVERAL VIEWS OF THE DRAWINGS

A sample embodiment of the disclosure is set forth in the following description, is shown in the drawings and is particularly and distinctly pointed out and set forth in the appended claims. The accompanying drawings, which are fully incorporated herein and constitute a part of the specification, illustrate various examples, methods, and other example embodiments of various aspects of the disclosure. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

Similar numbers refer to similar parts throughout the drawings.

DETAILED DESCRIPTION

As depicted throughout the figures, an outdoor power unit is depicted generally at 10. The outdoor power unit may be a powered drivable machine. More particularly, the outdoor power unit may be embodied in the form of a snow blower/thrower or a powered drivable machine 10. Powered drivable machine 10 is configured to engage an operator wearing an electrically powered garment, such as a heated jacket or a cooling vest, and provide power to the electrically powered garment from the powered drivable machine 10. Powered drivable machine 10 may also be referred to herein and in the appended claims as an outdoor power unit or a ridable power unit or a powered drivable machine, regardless of whether the device is actually a mower or a snow thrower, which is just some examples of an outdoor power unit.

Figure 2:
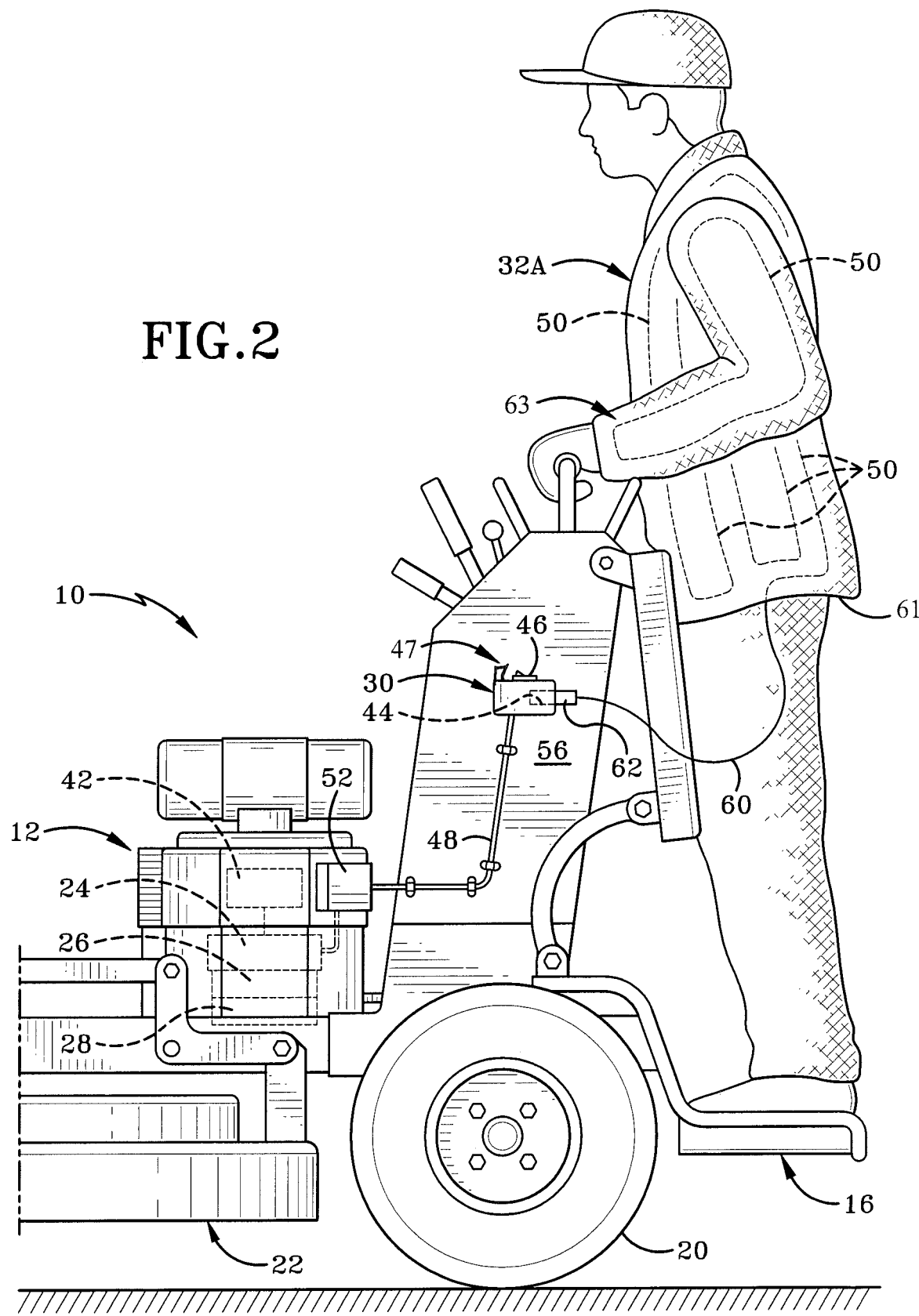
FIG. 2 (FIG. 2) is an operational partial side elevation view of the lawn mower controlled by an operator wearing a first embodiment garment.
Figure 3:
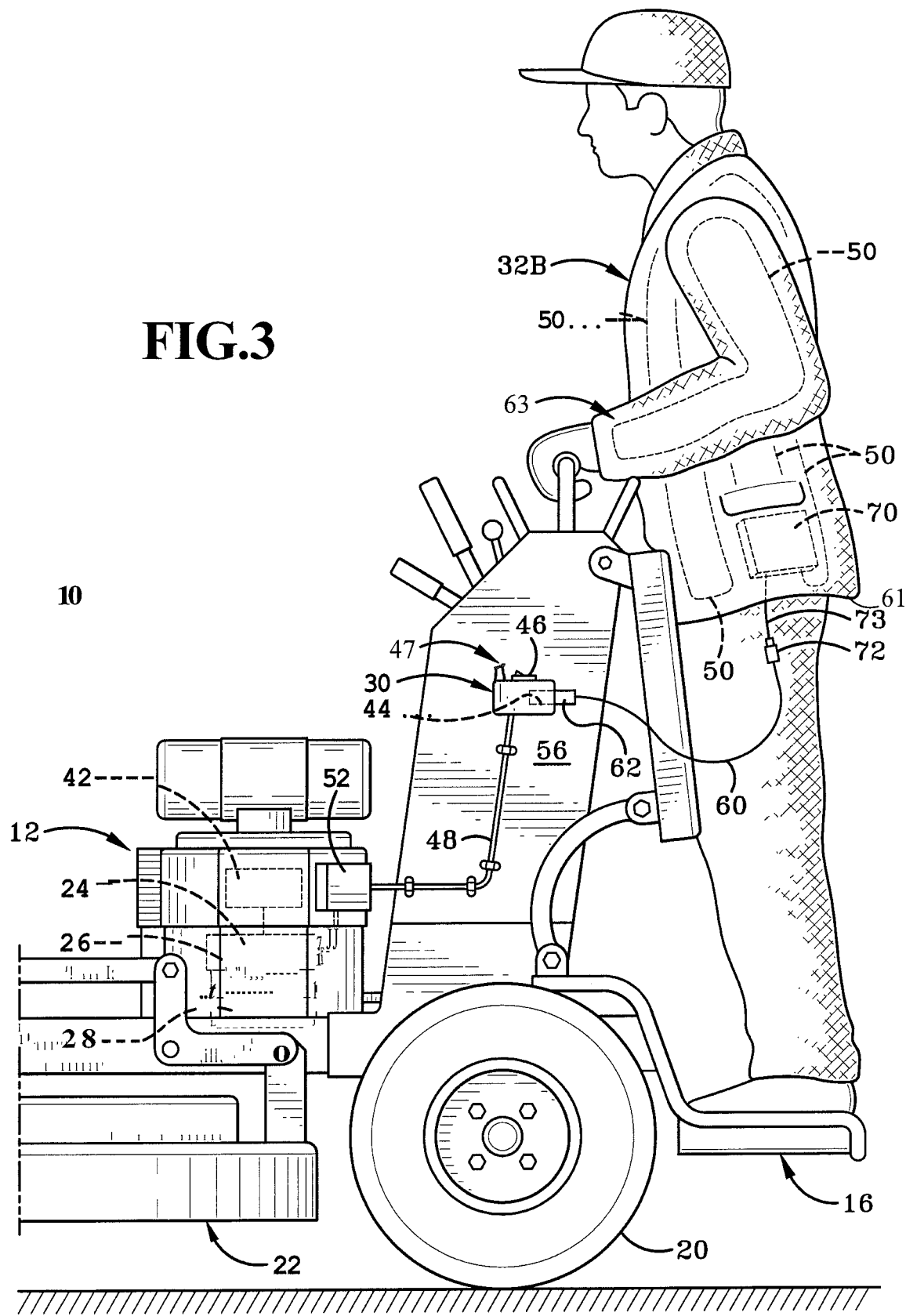
FIG. 3 (FIG. 3) is an operational partial side elevation view of the lawn mower controlled by an operator wearing a second embodiment garment.

Powered drivable machine 10 may include an engine 12, a mower frame 14, an operator support 16, machine drive controls 18, ground engaging wheels 20, a mower deck 22, an alternator 24, a flywheel 26, a stator 28, and an electrical port 30 configured to be electrically connected with an electrically powered garment, such as garment 32A in FIG. 2 or garment 32B in FIG. 3.

Powered drivable machine 10 includes a forward end 36 and a rear end 38 defining a longitudinal direction therebetween. Similarly, powered drivable machine 10 includes a first side and second side defining a transverse direction therebetween. Additionally, powered drivable machine 10 includes a lower end defined by the ground engaging wheels 20 and an upper end defined by the machine drive controls 18 that define a vertical direction therebetween.

Engine 12 is supported by frame 14 and is coupled thereto as one having ordinary skill in the art would understand. Additionally, engine 12 may be positioned at any location intermediate the forward end 36 and the rear end 38. Further, the engine 12 may be located at any position on powered drivable machine 10 intermediate the first side and the second side. Additionally, engine 12 may be any conventionally known engine configured to power the powered drivable machine 10. In one particular example, engine 12 may be an internal combustion engine. However, another exemplary embodiment, the engine 12 may be an electric mower with a drive shaft coupled to various wheels or pulley or other gears to effectuate rotational movement of components, such as the drive wheels 20 on the power unit 10. When engine 12 is embodied as an electric motor, the electric motor may have a larger battery source that is carried by the mower frame, at least indirectly, to power the electric motor. The electric motor battery may be rechargeable in a conventionally known manner to allow the mower or powered driven machine 10 to deplete the main battery associated with the electric motor (i.e. engine 12) to perform the various actions and modes of operations in discussed in greater detail below.

Figure 1:
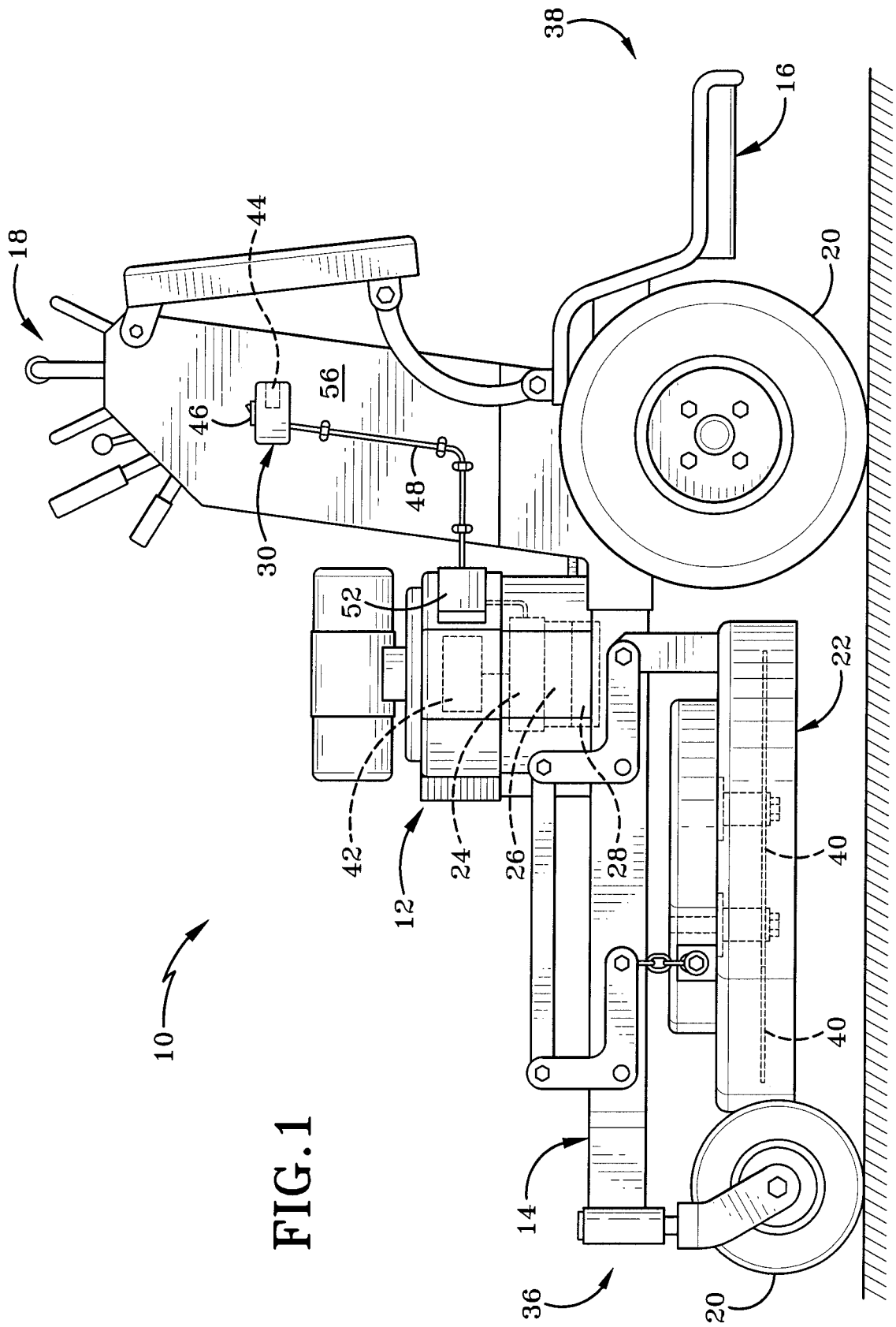
FIG. 1 (FIG. 1) is a side elevation view of a lawn mower including an electrical port.

Operator support 16 is attached to frame 14 in a rigid manner such that an operator is able to sit or stand with their body weight supported by operator support 16. Operator support 16 is depicted in FIG. 1 as a platform upon which an operator stands and in this scenario, powered drivable machine 10 is a zero turn riding lawn mower. However, operator support 16, as depicted in FIG. 1, is not intended to be limiting, and as one having ordinary skill in the art would understand and foresee, operator support 16 may be in the form of a seat positioned closely adjacent engine 12 supported by frame 14.

The machine drive controls 18 are located adjacent the operator support 16 in order to give the operator the ability to manually adjust various controls in order to move powered drivable machine 10 in the desired direction. As one having ordinary skill in the art would understand, the drive controls 18 may be operatively connected and in logical communication with electric motor or engine 12 which is in operative communication with drive wheels 20. Thus, actuation of mower controls 18 can move powered drivable machine 10 in the forward or rearward direction or toward the first side or toward the second side. Additionally, mower controls 18 may be operatively connected to mower deck 22 which includes a rotatable blade 40 as one having ordinary skill in the art would understand. Mower deck 22 is preferably positioned intermediate the wheels 20, however other scenarios may provide a situation where the mower deck 22 is forward from the foremost wheel or rearward from the rearmost wheel.

The alternator 24 is operatively connected to the engine 12 and indirectly or directly supported by the frame 14 intermediate the forward end 36 and the rear end 38. As one having ordinary skill in the art would understand, alternator 24 is configured to output an electrical current. In the preferred embodiment of the present disclosure, the electrical current output from alternator 24 is a direct current. The direct current output from alternator 24 may be connected to a mower battery 42 configured to drive the electrical systems of powered drivable machine 10 as one having ordinary skill in the art would understand. The mower battery is generally indicated at 42 and its position represented in FIG. 1 is not intended to be limiting and rather is shown pictorially to indicate that the mower battery 42 is configured to power the powered drivable machine 10 and not garment 32A or garment 32B. As will be described in greater detail below, the electrical port 30 is also coupled, at least indirectly, with alternator 24 and is configured to power garment 32A or 32B, and that some supplemental batteries located in garment 32B do not power powered drivable machine 10 like mower battery 42 does. However, in another embodiment, rather than being coupled to the alternator, the port may be coupled with the battery. In this instance, the port is indirectly with the alternator via the battery. Thus, garment 32A or 32B may receive electrical current from either alternator 24 or battery 42.

The alternator 24 may also include the flywheel 26 with a magnetic rotor fixedly attached thereto. The flywheel 26 enables alternator 24 to be a permanent magnetic-type flywheel alternator that has no brushes, no commutator, no belts, and requires little to no adjustments. The stator 28 includes a plurality of coils wound in series in order to create magnetic flux as the magnetic rotor on flywheel 26 rotates around or adjacent the stationary coils of stator 28. While not shown in FIG. 1, one having ordinary skill in the art would understand and foresee that the flywheel alternator as depicted would also include a rectifier module and a regulator module.

The direct current output from alternator 24 depends on the coil arrangement present in stator 28. Accordingly, and in accordance with the present disclosure, there may be advantages of producing different DC currents output from alternator 24. As such, stator 28 is designed to be repeatably releasable and interchangeable with other stators having similar mounts to operatively connect with flywheel 26 but have alternative coil arrangements. With the varying coil arrangements, the operator is able to selectively determine the electrical DC current output from alternator 24. In accordance with the present disclosure, the DC electrical current output from alternator 24 may be selected from a voltage group comprising 12 volts, 16 volts, 18 volts, 20 volts, and 48 volts.

It is noteworthy that, in other embodiments, when machine 10 is powered by a main battery connected to an electric motor (regardless of whether machine is an electric snow blower/thrower or an electric lawn mower), there may not be a need for an alternator. These electrically powered embodiments of machine 10 may provide a direct electrical connection between the main battery of machine 10 and the electrical port 30. A transformer or regulator may be connected between the main battery and the electrical port.

Electrical port 30 defines an electric terminal slot 44 in which an exposed end of wire 48 (i.e., an electric terminal) is at least indirectly located. Electrical port 30 may also be referred to as an electrical outlet in one embodiment. Wire 48 is operatively connected to alternator 24 to enable current to flow therealong. In other embodiments, wire 48 is operatively connected to battery 42. Furthermore, port 30 may be coupled with a switch 46 to selectively permit and preclude current flow along wire 48 when an external device, such as garment 32A or garment 32B is plugged into slot 44. A voltage regulator or a current regulator, or a combination voltage and current regulator 52 may be positioned along wire 48 intermediate electrical port 30 and alternator 24. One exemplary slot 44 is sized to accommodate a USB-plug, or is otherwise known as a USB slot. More particularly, port 30 may be a female USB slot. In one example, port 30 on the powered drivable machine 10 is open to the outside environment and not within a cabin ("cab") that is typically found in a vehicle/car/truck or tractor.

In one exemplary embodiment, regulator 52 may be a transformer disposed electrically between the port 30 and either the alternator 24 or the battery 42. In a broader aspect, the regulator 52 may be a transformer that is disposed electrically between the alternator 24 or batter 42 and the heating or cooling element on garment 32A or garment 32B. The transformer is operative to alter either the voltage or current output from the alternator or battery such that the port 30 transmits voltage or power different than that which is output from the alternator 24 or the battery 42. In one particular example, garment 32A or 32B is a low voltage garment that can either heat or cool the operator. As such, the transformer is operative to transform the higher voltage or higher current output from the battery 42 or alternator 24 to a lower voltage or current so as to not damage the low voltage wires within garment 32A or garment 32B. In another particular embodiment, the transformer may be located on the garment itself, rather than in or near the electrical port. In this embodiment, it may advantageous to put the transformer on the garment 32A or the garment 32B because if the transformer is on the powered drivable machine 10 then the port 30 will have limited number of uses inasmuch as the port 30 will become a low voltage port. However, it may be possible to add a second switch 47 to the transformer to enable the transformer to be bypassed to allow the port 30 to operate as either a high voltage or low voltage port 30 depending on whether the second switch 47 coupled to the transformer is turned on or turned off. The second switch may be located adjacent the first switch 46 and have sufficient indicators to identify whether the port is operating in a low voltage capacity or a high voltage capacity depending on the throw of the second switch. Thus, first switch 46 may be a switch that turns the port 30 on and off and the second switch 47 may be a switch that selectively enables an operator to choose a high voltage or a low voltage electrical current to move through the port 30 when first switch 46 is turned to its on position.

Port 30 may be mounted and attached to a mower panel 56. In one particular embodiment, port 30 may be closely adjacent mower controls 18 and positioned vertically below controls 18 and above engine 12. In other instances, port 30 may be positioned rearwardly from engine 12. However, this is not intended to be limiting and there could be scenarios where port 30 is positioned forwardly from engine 12. Port 30 may be further positioned about waist high, in a range from about 25 inches to about 40 inches above operator support 16 in order to enable either garment 32A or garment 32B to plug into slot 44 with a minimal amount of electrical cord extending from the garment to the port 30. The panel 56 supporting port 30 may be directly connected to frame 14. Thus, port 30 may be referred to as indirectly coupled to frame 14. As this is a riding lawn mower, the electrical port 30 is open to the outside elements and is not positioned within a cabin (or a cab) of a vehicle such as a tractor or car. However, port 30 may have a cover or flap to protect wire 48 in port 30 from the outdoor elements.

Wire 60 carrying plug 62 may be carried relative to garment 32A so as to reduce the overall length of the wire 60 needed to establish the electrical connection between plug 62 and port 30. In one example, when port 30 is a female USB port, then the plug is a complementary male USB plug. The exterior wire 60 may extend outwardly from garment 32 adjacent the lower portion of the overcoat. This should position the plug 62 closely adjacent the port 30 without needing a significant amount of distance or dimensional length for the exterior wire 60 to complete the selective connection between plug 62 and port 30. Furthermore, by having wire 60 terminating in the plug 62 extend outwardly from the bottom of the garment 32A, it leaves the operators arms free to maneuver and manipulate or otherwise control the powered drivable machine 10. Thus, while it is possible for the wire 60 terminating in plug 62 to extend outwardly from one of the sleeves or even an upper portion of the garment 32A, there may be reasons to not provide such a configuration. For example, if the wire 60 terminating in the plug 62 extended outwardly from one of the sleeves, then when the plug 62 is connected with port 30, the wire 60 may limit the range of motion that the operator may have for that respective sleeve. Furthermore, if the wire 60 terminating in the plug 62 extended outwardly from the chest or collar area of the garment 32A, then a greater length of wire 60 would be needed to complete the connection of plug 62 with port 30. Additionally, as discussed above, in the embodiment when the transformer on the garment 32A to effectuate the transformation of the voltage output from the alternator 24 or the battery 42, the transformer may be located within plug 62. However, it is entirely possible that transformer be located along other portions of wire 60 so as to position the transformer within garment 32A.

As depicted in FIG. 2, a first embodiment in accordance with the present disclosure provides first exemplary garment 32A as an overcoat. Garment 32A includes electrically resistive heating elements strung throughout the coat. The heating elements 50 are connected to an exterior wire 60 terminating in a plug 62 shaped complementary to slot 44 and is configured to be inserted therein. In one example, wire 60 extends outwards from the garment below a bottom hem 61. However, wire 60 may alternatively extend from sleeve 63 or a chest region of the garment. Plug 62 includes at least indirectly exposed wires configured to electrically connect with the at least indirectly exposed ends of wire 48. When the plug 62 is connected to port 30 and the switch 46 is turned "ON", electric current is able to flow from the alternator to the resistive heating elements 50. In this instance, the second switch would be engaged to have the regulator 52 or transformer ensure that the low voltage current flows through port 30 into wire 60. The heating elements 50 receiving current therethrough heat up and provide warmth to the operator wearing the garment 32A. The garment 32A depicted in FIG. 2 is not intended to be limiting. Thus, while a jacket is shown that provides heating elements 50 to keep the operator warm, the garment 32A could just as easily be embodiment in a vest utilizing thermoelectric cooling (TEC) elements to provide a cooling effect for the operator wearing the garment 32A (Note: Reference numeral 50 may also refer to the TEC elements providing a cooling effect). One exemplary TEC element uses the Peltier effect to create a heat flux between the junction of two different types of materials and may be provided in wire format to be strung throughout the garment such that a cool first side (opposite a warm second side) of the TEC element faces the wearer's body.

As depicted in FIG. 3, a second embodiment in accordance with the present disclosure provides second exemplary garment 32B as an overcoat. Garment 32B includes electrically resistive heating elements strung throughout the coat. The heating elements 50 are directly connected to a rechargeable battery 70 carried by the garment. In one embodiment, the battery 70 may be carried within or adjacent a pocket of the garment. This enables garment 32B to be washable when the battery 70 is removed. Alternatively, battery 70 may be sewn into the garment. Garment 32B includes exterior wire 60 terminating in a plug 62 shaped complementary to slot 44 and is configured to be inserted therein. Exterior wire 60 further includes a second plug 72 which may be directly connected to battery 70 or to a exteriorly extending battery wire 73. Plug 62 includes wires configured to electrically connect with the exposed ends of wire 48. When the plug 62 is connected to port 30 and the switch 46 is turned "ON", electric current is able to flow from the alternator to charge the battery 70. The battery 70 may be charged from the alternator to a point where battery 70 has a sufficient amount of stored power. The second plug 72 may be disconnected such that battery 70 provides the electrical current to power heating elements 50.

In another example associated with the second garment 32B, the battery 70 may be wired in a manner that enables low voltage current to charge the battery 70 in parallel with powering the heating elements or TEC cooler in garment 32B. For example, when the plug 62 is connected with the port 30 while the operator is using the powered drivable machine 10, the current may charge battery 70 while simultaneously powering the heating element or TEC cooler. Thus, battery would not need to power the heating element(s) or TEC cooler when plug 62 of garment 32B is plugged into port 30. However, garment 32B may be wired or programmed to recognize that when the plug 62 is disconnected from port 30, then the battery 70 is activated to provide the primary power to heating element(s) or TEC cooler(s). Then, when the plug 62 is disconnect from port 30, the battery 70 is activated by battery activation logic to power the heating elements 50 or the TEC cooler(s). In one example, this would be advantageous to an operator who frequently gets on and off the powered drivable machine 10. Namely, an operator mowing a long fence line typically needs to dismount from the mower to trim around the fence posts. Or, an operator plowing snow with a snow blower needs to dismount the snow blower and perform a secondary snow removal actions, such as shoveling a sidewalk. After dismounting and disconnecting plug 62 from port 30, the battery 70 would be activated to power heating element 50 or TEC cooler(s) to maintain the desired temperature of garment 32B worn by the operator.

"Logic" or "battery activation logic", as used herein, includes but is not limited to hardware, firmware, software and/or combinations of each to perform a function(s) or an action(s), and/or to cause a function or action from another logic, method, and/or system. For example, based on a desired application or needs, battery activation logic may include a software controlled microprocessor, discrete logic like a processor (e.g., microprocessor), an application specific integrated circuit (ASIC), a programmed logic device, a memory device containing instructions, an electric device having a memory, or the like. Logic may include one or more gates, combinations of gates, or other circuit components. Logic may also be fully embodied as software. Logic may further be embodied as instructions stored in a machine readable medium that may be executed by a microprocessor to perform a desired function. For example, the battery activation logic may include instructions to automatically initiate current movement to the electrically powered element in response to disconnection of the plug from the complementary port 30 on the lawn mower 12. Additional instructions in the battery activation logic permit selective current movement to the electrically powered element 50, as selected by the operator, in response to disconnection of the plug 62 from the complementary port on the lawn mower 12. Where multiple logics are described, it may be possible to incorporate the multiple logics into one physical logic. Similarly, where a single logic is described, it may be possible to distribute that single logic between multiple physical logics.

The heating elements 50 receiving current therethrough from the battery 70 heat up and provide warmth to the operator while wearing the garment 32B. The garment 32B depicted in FIG. 3 is not intended to be limiting. Thus, while a jacket is shown that provides battery 70 powering heating elements 50 to keep the operator warm (or cool), the garment 32B could just as easily be embodied in a vest carrying battery 70 powering TEC elements to provide a cooling effect for the operator wearing the garment 32B Furthermore, while the two exemplary garments 32A or 32B is depicted as being worn by the upper body portion of the operator, clearly the advantages of garment 32A or 32B could be equally applied to garments worn by the operator over the lower portion of their body, such as pants or shorts, or even shoes. Similarly, the teachings of garment 32A or 32B could be equally applied to garment accessories, such as heated or cooling hats, gloves, ear muffs, scarves, coveralls, or gaiters configured to be plugged into powered drivable machine 10.

Furthermore, either garment 32A or 32B may be incorporated with a winding and unwinding reel carrying the extension cord or wire 60, wherein the extension cord spools about the reel between a wound position and unwound position to enable the operator to plug the plug 62 into the outlet/port 30.

In accordance with one aspect of the present disclosure, powered drivable machine 10 provides improved advantages of thermo-effects to a garment worn by the mower operator. One garment may be electrically connected to the port 30 supported by the mower to power the garment worn by the operator. The powering of the garment may be used to either warm the operator or cool the operator depending on the environmental weather conditions. For example, if the outdoor temperature is above about seventy or about seventy five degrees Fahrenheit, then the mower will power garment-carried TEC elements to cool the operator. If the outdoor temperature is below about seventy or about sixty degrees, then the garment will power garment carried resistive heater to warm the operator.

In operation and with respect to FIG. 2 depicting the first embodiment garment 32A, an operator wearing the garment 32A may be supported by operator support 16. The operator may then grasp exterior wire 60 and insert plug 62 into slot 44 on port 30. The exterior wire 60 is shown as exiting garment 32A adjacent a bottom hem, however this is not intended to be limiting. However, it may be desirable to ensure wire 60 is sufficiently short such that it does not entangle while the operator is controlling powered drivable machine 10 via controls 18. Other embodiments may provide a wire 60 coupled with a retracting mechanism to automatically reduce the length of wire 60 to a sufficiently safe length.

As the mower is driven, the alternator 24 receives power from engine 12. The electrical power output from alternator 24 is dependent on the flywheel 26 and interchangeable stator 28 arrangement described above, and the electrical power output is directed along wire 48 to electrical port 30. The electrical current extends through port 30 into plug 62 along wire 60 to power thermo-electrical heating elements 50. The powered elements increase in temperature to provide warmth to the operator donning the garment 32A. Alternatively, this arrangement may provide a cooling effect when the thermo-electric elements 50 are thermo-electric coolers.

In the embodiment utilizing garment 32B, the electrical power output fed to port 30 charges battery 70 via second plug 72 establishing an electrical connection therebetween. The operator wearing garment 32B may power elements 50 via a direct connection, thus effectively bypassing battery 70, or the electrical connection may be used to charge battery 70 when it has been drained or somewhat drained (i.e., depleted or partially depleted) during its powering of elements 50. Garment 32B has wiring that electrically powers the battery 70 and the electrically powered element 50 simultaneously in parallel.

An exemplary power unit 10, which may include an internal combustion engine or be powered by a main battery connected to an electric motor, in accordance with the present disclosure is embodied in U.S. Patent Application No. 62/610,682 filed on Dec. 27, 2017 entitled "CHARGING STATION MOUNTED ON A LAWN MOWER", which is co-owned at the time of filing, and all corresponding non-provisional utility application claiming priority to the same, are each hereby incorporated in their entirety by reference as if fully re-written herein.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "above", "behind", "in front of", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral", "transverse", "longitudinal", and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present invention.

An embodiment is an implementation or example of the present disclosure. Reference in the specification to "an embodiment," "one embodiment," "some embodiments," "one particular embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, any method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

What is claimed:

1. A system comprising:
   a powered stand-on riding mower including an electrical port operatively connected a current source to provide electrical power therethrough when a plug is plugged into the port;
   a garment sized to be worn by an operator of the engine powered drivable machine, wherein the garment includes at least one electrically powered thermo-electric element electrically coupled to the plug; and
   wherein when the plug is connected to the port, the at least one thermo-electric element draws power from the powered stand-on riding mower to change temperature in order to warm or cool the operator wearing the garment.

2. The system of claim 1, wherein the port on the powered stand-on riding mower is open to the outside environment and not within a cab.

3. The system of claim 2, wherein the powered stand-on riding mower is a zero-turn mower.

4. The system of claim 1, wherein the powered stand-on riding mower further includes:
   a forward end opposite a rear end;
   a motor or engine positioned forwardly from a drive control; and
   the port positioned rearward from the motor or engine.

5. The system of claim 4, wherein the port is proximate the drive control and attached to a vertically aligned support panel.

6. The system of claim 5, further comprising a selectively actuating switch on the electrical port.

7. The system of claim 1, wherein the garment is selected from the group consisting of: coveralls, a jacket, pants, a hat, gloves, a scarf, and a neck gaiter.

8. The system of claim 1, wherein the garment further comprises a rechargeable battery carried by the garment powering the at least one thermo-electric element; wherein the plug on the garment recharges the battery as the battery is drained.

9. The system of claim 1, further comprising an electrically conductive extension cord carrying the plug configured to connect with the port.

10. The system of claim 9, further comprising a winding and unwinding reel carrying the extension cord, wherein the extension cord spools about the reel between a wound position and unwound position.

11. An outdoor power unit comprising:
    a front end spaced form a rear end defining a longitudinal direction therebetween;
    an electric motor supported by a frame;
    a main battery connected to the electric motor; and
    a garment-powering electrical port in electrical communication with the main battery to provide electrical current through the port when an electrically powered garment, worn by an operator of the power unit, is connected to the garment-powering electrical port;
    wherein the outdoor power unit is selected from the group comprising a lawn mower and a snow thrower; and
    the outdoor power unit is free of an internal combustion engine such that the outdoor power unit is one of an all-electric lawn mower and an all-electric snow thrower.

12. The outdoor power unit of claim 11, further comprising a switch at the garment-powering electrical port enabling the operator to selectively provide the electrical current through the electrical port.

13. The outdoor power unit of claim 12, further comprising a vertical panel extending upwardly from the frame; wherein the electrical port is attached to the panel.

14. The outdoor power unit of claim 12, wherein the electrical port is positioned adjacent drive controls of the outdoor power unit.

15. The outdoor power unit of claim 12, wherein the electrical port is positioned at a height in a range from about 25 inches to about 40 inches above a stand-on operator support, and adapted to enable the garment to plug into the port with a minimal amount of electrical cord extending from the garment to the port.

16. The outdoor power unit of claim 11, further comprising an alternator and a flywheel, and stator combination operatively connected to the alternator directing alternator output voltage, wherein the alternator is the electrical current source.

* * * * *